United States Patent
Li et al.

(10) Patent No.: US 11,737,316 B2
(45) Date of Patent: Aug. 22, 2023

(54) DISPLAY PANELS AND MANUFACTURING METHODS THEREOF

(71) Applicant: Yungu (Gu'an) Technology Co., Ltd., Langfang (CN)

(72) Inventors: Mengzhen Li, Langfang (CN); Chuang Chen, Langfang (CN); Lin He, Langfang (CN); Xiaokang Zhou, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 874 days.

(21) Appl. No.: 16/342,988

(22) PCT Filed: Nov. 7, 2018

(86) PCT No.: PCT/CN2018/114415
§ 371 (c)(1),
(2) Date: Apr. 18, 2019

(87) PCT Pub. No.: WO2019/218618
PCT Pub. Date: Nov. 21, 2019

(65) Prior Publication Data
US 2021/0376004 A1 Dec. 2, 2021

(30) Foreign Application Priority Data
May 14, 2018 (CN) .............................. 201810458362

(51) Int. Cl.
*H01L 27/32* (2006.01)
*H10K 59/121* (2023.01)
(Continued)

(52) U.S. Cl.
CPC ........... *H10K 59/121* (2023.02); *H10K 50/15* (2023.02); *H10K 50/16* (2023.02); *H10K 50/171* (2023.02); *H10K 50/85* (2023.02); *H10K 71/00* (2023.02)

(58) Field of Classification Search
CPC ...... H10K 59/121; H10K 50/15; H10K 50/16; H10K 50/171; H10K 50/85; H10K 71/00; H10K 59/1201; H10K 59/12
See application file for complete search history.

(56) References Cited

U.S. PATENT DOCUMENTS

2016/0095172 A1  3/2016  Lee
2016/0343787 A1* 11/2016 Wu ...................... H10K 59/00
2018/0123073 A1  5/2018  Bang et al.

FOREIGN PATENT DOCUMENTS

CN  104536179 A  4/2015
CN  105470407 A  4/2016
(Continued)

OTHER PUBLICATIONS

CN First Office Action dated Jun. 5, 2019 in the corresponding CN application (application No. 201810458362.3).

*Primary Examiner* — Jack S Chen
(74) *Attorney, Agent, or Firm* — Kilpatrick Townsend & Stockton (57) ABSTRACT

The present disclosure relates to a display panel (10) and a method of manufacturing the same. The display panel (10) includes a substrate (101), a number of light transmissive units (320), and an package layer (600). The substrate (101) has a light transmissive region (700) and a pixel display region (800). The light transmissive region (700) and the pixel display region (800) are complementarily disposed with respect to the substrate (101). The plurality of light transmissive units (320) are disposed in the light transmissive region (700) and overlay a surface of the substrate (101)

(Continued)

within the light transmissive region (700). The package layer (600) overlays a surface of a number of light transmissive units (320). In the present disclosure, the substrate (101) has a different structure in the light transmissive region (700) and the pixel display region (800).

9 Claims, 11 Drawing Sheets

(51) Int. Cl.
*H10K 50/15* (2023.01)
*H10K 50/16* (2023.01)
*H10K 50/85* (2023.01)
*H10K 50/17* (2023.01)
*H10K 71/00* (2023.01)

(56) References Cited

FOREIGN PATENT DOCUMENTS

| CN | 107658332 A | 2/2018 |
|---|---|---|
| CN | 107819018 A | 3/2018 |
| CN | 207264695 U | 4/2018 |
| CN | 108022955 A | 5/2018 |
| CN | 207338380 U | 5/2018 |
| CN | 108428729 A | 8/2018 |

* cited by examiner

DISPLAY PANELS AND MANUFACTURING METHODS THEREOF

CROSS REFERENCE TO RELATED APPLICATIONS

This application is a National Stage for International Application PCT/CN2018/114415, filed on Nov. 7, 2018, which claims the priority benefit of Chinese Patent Application No. 201810458362.3, titled "DISPLAY PANELS AND MANUFACTURING METHODS THEREOF" and filed on May 14, 2018. The entireties of both applications are incorporated by reference herein for all purposes.

TECHNICAL FIELD

The present disclosure relates to displays.

BACKGROUND

A full screen has a relatively large occupation screen ratio and an ultra-narrow frame which can greatly improve user's visual effect, and thus has received widespread attention. At present, in a display device with a full screen, in order to realize functions of self-photographing, video calling, and fingerprint recognition, an irregular-shaped region is usually defined on a front surface of the display device. This special-shaped region is used to install a camera, an earpiece, a fingerprint recognition, or a physical button. When defining a special-shaped region, the display panel is required to be cut. However, cutting may lead to the occurrence of phenomena such as a poor displaying, a poor touch, a poor process, or the like, which further lead to a worse displaying effect of the whole display screen.

SUMMARY

According to various embodiments of the present disclosure, a display panel and a manufacturing method thereof are provided.

A display panel includes a substrate, a plurality of light transmissive units, and a package layer. The substrate has a light transmissive region and a pixel display region, and the light transmissive region and the pixel display region are complementarily disposed with respect to the substrate. The plurality of light transmissive units overlay the substrate within the light transmissive region. The package layer overlays the plurality of light transmissive units.

A manufacturing method of a display panel includes:

providing a substrate having a first region and a second region, the first region and the second region being complementarily disposed with respect to the substrate;

depositing a buffer layer thereon within the first region and the second region;

depositing an active layer on a surface of the buffer layer;

etching away the active layer located within the first region;

depositing a first insulating layer and a first metal layer sequentially thereon within the first region and the second region;

etching away the first metal layer located within the first region;

depositing a second insulating layer and a second metal layer sequentially thereon within the first region and the second region;

etching away the second metal layer located within the first region;

depositing a third insulating layer and a third metal layer sequentially thereon within the first region and the second region;

etching away the third metal layer located within the first region;

depositing an anode layer thereon within the first region and the second region;

etching away the anode layer located within the first region;

depositing a plurality of light transmissive units thereon within the first region and the second region;

depositing a cathode layer on a surface of the light transmissive units;

etching away the cathode layer located within the first region; and depositing a package layer thereon within the first region and the second region.

Details of one or more embodiments of the invention are set forth in the accompanying drawings and the description below. Other features, objects, and advantages of the invention will be apparent from the description and drawings, and from the claims.

DETAILED DESCRIPTION OF THE EMBODIMENTS

Embodiments of the disclosure are described more fully hereinafter with reference to the accompanying drawings. The disclosure may, however, be embodied in many different forms and should not be construed as limited to the embodiments set forth herein. Rather, these embodiments are provided so that this disclosure will be thorough and complete.

Figure 1:
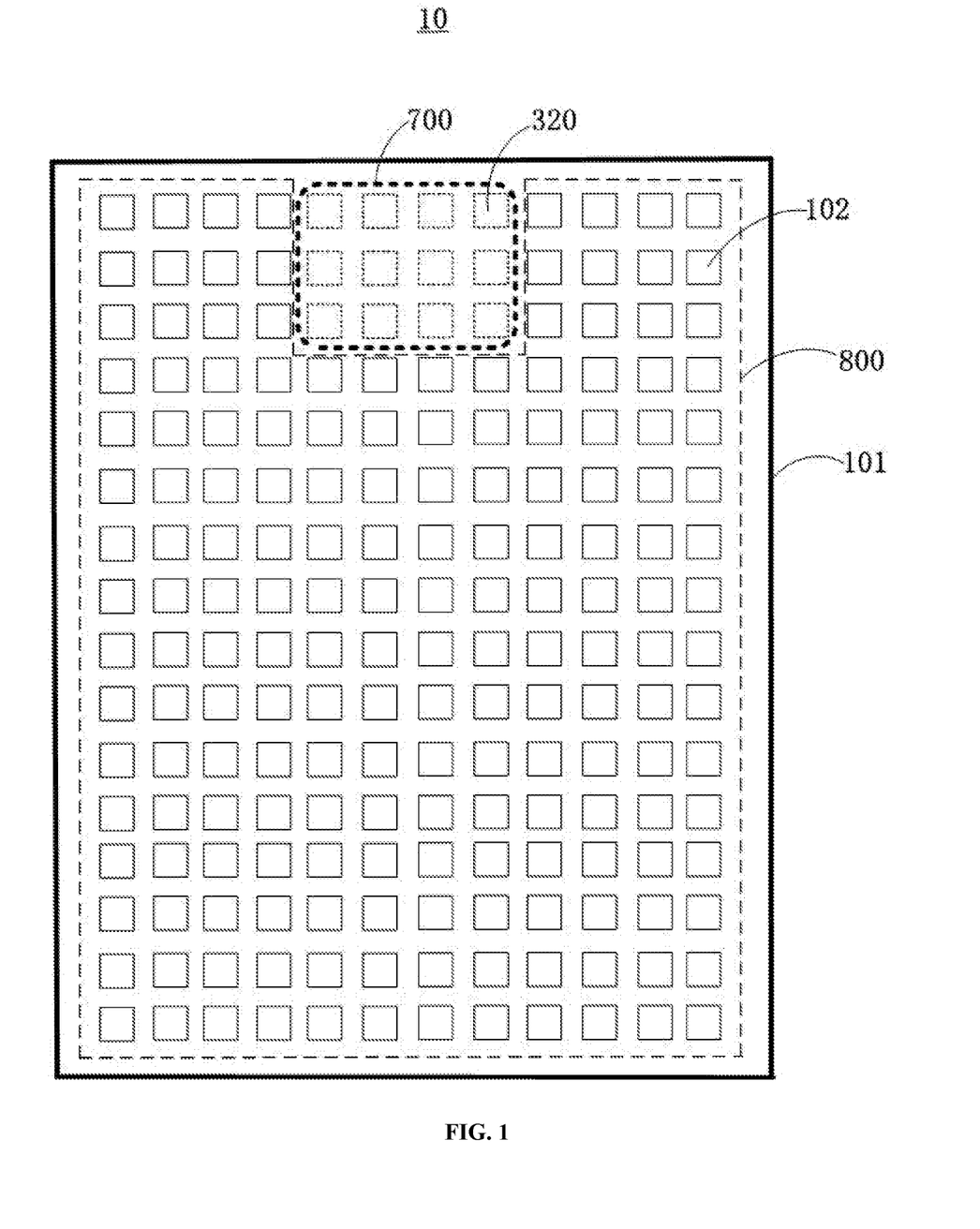
FIG. 1 is a schematic diagram of a display panel according to an embodiment.
Figure 2:
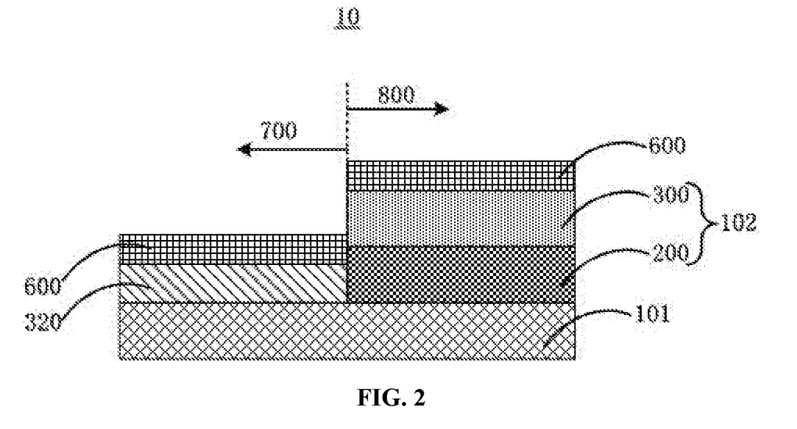
FIG. 2 is a cross-sectional view of a display panel according to an embodiment.

Referring to FIGS. 1 and 2, a display panel 10 of an embodiment includes a substrate 101. The substrate 101 has a light transmissive region 700 and a pixel display region 800. The light transmissive region 700 and the pixel display region 800 are complementarily disposed with respect to the substrate 101. The "complementarily disposed" refers to that an entire region of the display panel 10 is either the pixel display region 800 or the light transmissive region 700, and the display panel 10 is no longer provided with a special-shaped notch or other regions.

Figure 3:
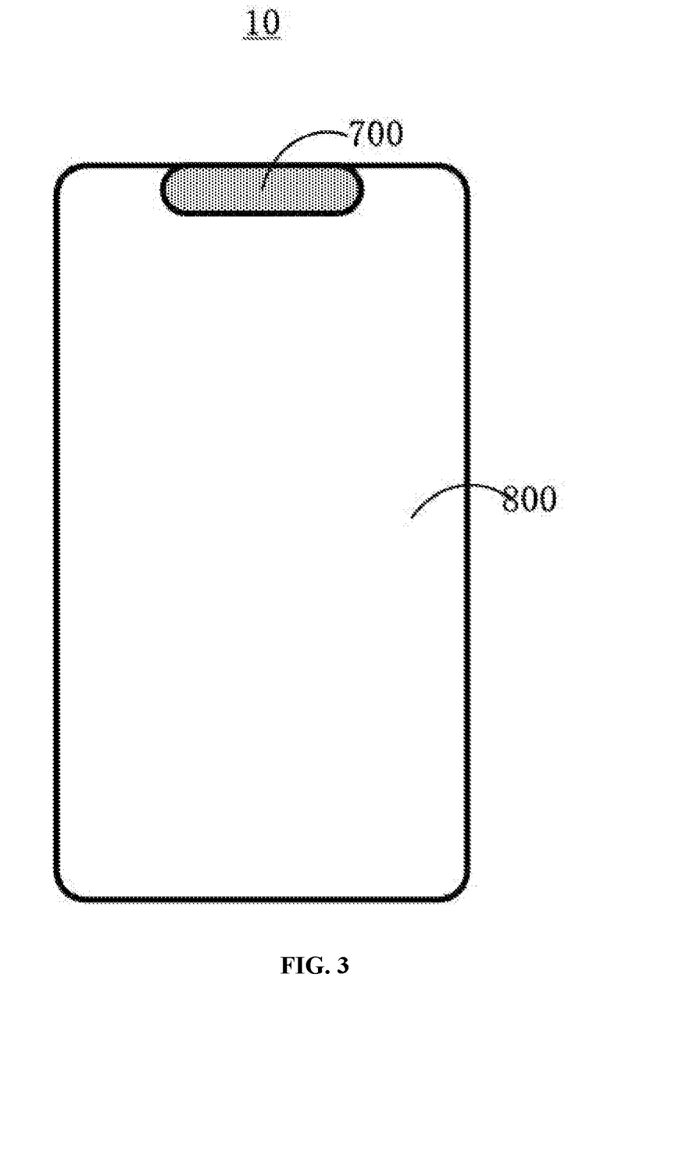
FIG. 3 is a schematic diagram of a display panel according to an embodiment.
Figure 4:
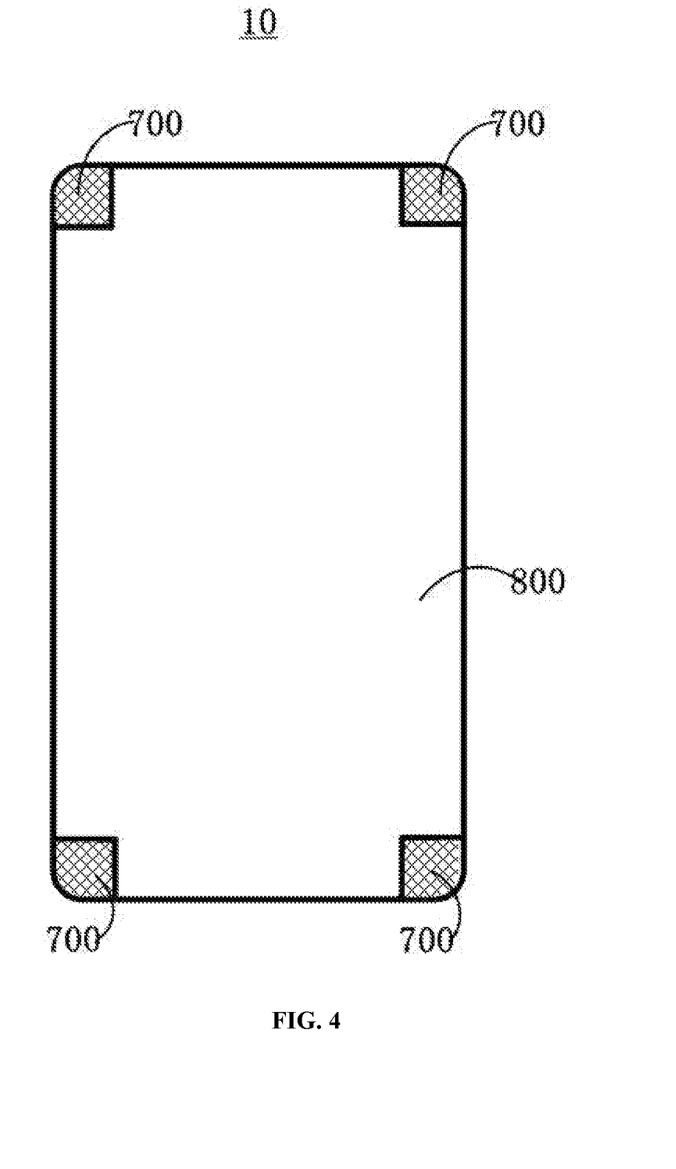
FIG. 4 is a schematic diagram of a display panel according to an embodiment.
Figure 5:
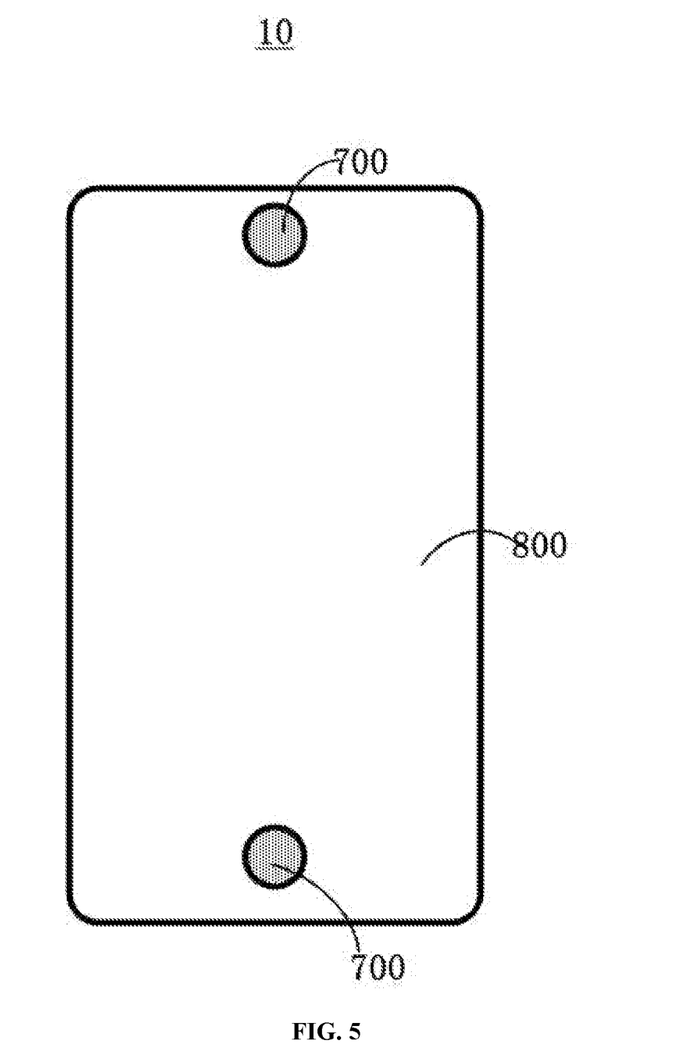
FIG. 5 is a schematic diagram of a display panel according to an embodiment.

The display panel 10 can include one or more light transmissive regions 700. The shape and position of the light transmissive region 700 are not specifically limited herein. Referring to FIG. 3, the light transmissive region 700 can be disposed at an uppermost center position of the display panel 10, and the light transmissive region 700 is disposed as a rounded rectangle. Referring to FIG. 4, the light transmissive region 700 can be disposed at four corners of the display panel 10, and the light transmissive region 700 is disposed as a sector of 90°. Referring to FIG. 5, the light transmissive region 700 can be disposed at any position of the display panel 10, and the light transmissive region 700 is disposed in a circular shape.

Referring again to FIG. 2, the display panel 10 includes a plurality of light transmissive units 320 and a package layer 600. The plurality of light transmissive units 320 are disposed in the light transmissive region 700, and the plurality of light transmissive units 320 overlay the substrate 101 located within the light transmissive region 700. The package layer 600 overlays surfaces of the plurality of light transmissive units 320. The plurality of light transmissive units 320 are disposed in both the light transmissive region 700 and the pixel display region 800. An electrode plate for driving the light transmissive units 320 to be lighted is not provided in the light transmissive region 700. A light transmittance of the light transmissive region 700 can reach 80% to 90%. In this way, the cutting process is avoided and display defects due to cutting are reduced. In a process of manufacturing the display screen, a lower position of the light transmissive region 700 of the display panel 10 can be used to mount a camera, an earpiece, a fingerprint recognition module, or a physical button. The display panel 10 avoids a generation of the display defects, touch defects, and process defects.

Figure 6:
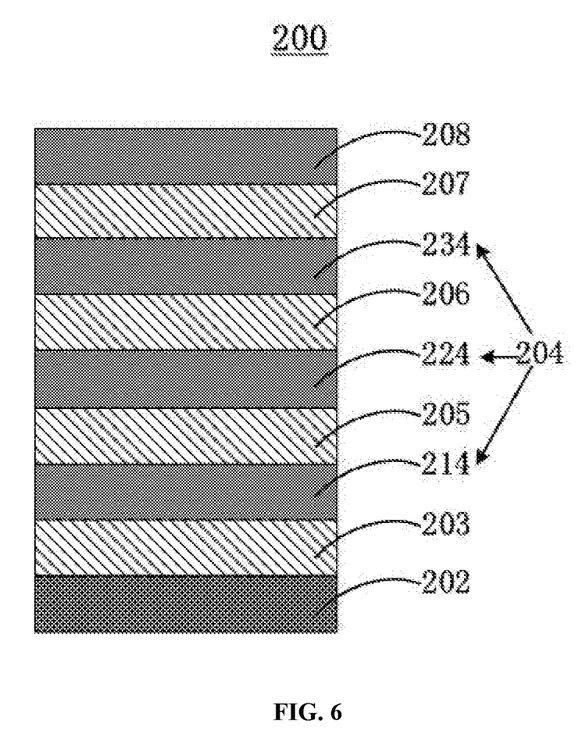
FIG. 6 is a cross-sectional view of a pixel array controlling circuit according to an embodiment.
Figure 7:
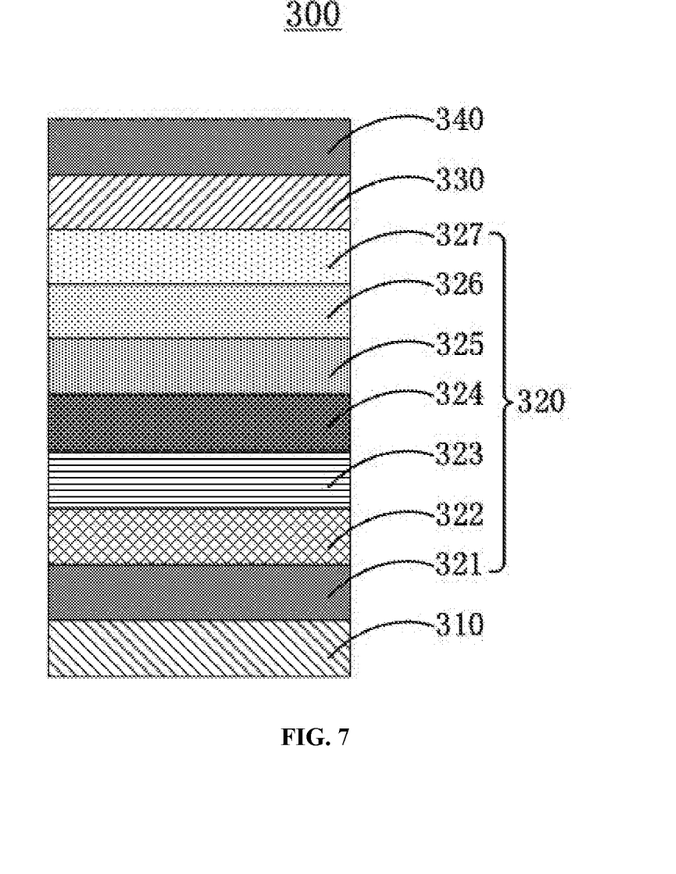
FIG. 7 is a cross-sectional view of an electroluminescent diode according to an embodiment.

Referring to FIG. 2, FIG. 6, and FIG. 7, in an embodiment, the display panel 10 further includes a pixel unit 102 and a package layer 600 disposed on the substrate 101 within the pixel display region 800. As shown in FIG. 2, the pixel unit 102 can include a pixel array controlling circuit 200 and an electroluminescent diode 300. The electroluminescent diode 300 can be selected from an electroluminescent device such as an Organic Light-Emitting Diode (OLED) or a Micro Light Emitting Diode (Micro LED). The pixel array controlling circuit 200 can include one or more Thin Film Transistors (TFT) and capacitors. The electroluminescent diode 300 is electrically connected to the pixel array controlling circuit 200. The pixel unit 102 is used to present a display of different colors. The pixel unit 102 requires a certain driving signal to be driven during the display process.

In an embodiment, the display panel 10 can be a liquid crystal display panel, and the pixel unit 102 includes a pixel electrode and a pixel array controlling circuit 200 electrically connected to the pixel electrode. In another embodiment, the display panel 10 is an electroluminescent display panel, and the pixel unit 102 includes an electroluminescent diode 300 and a pixel array controlling circuit 200 that is electrically connected to electroluminescent diode 300. The structure of the pixel array controlling circuit 200 in the liquid crystal display panel and the structure of the pixel array controlling circuit 200 in the electroluminescence display panel can be different.

In this embodiment, the display panel 10 can be a liquid crystal display panel or an electroluminescent display panel, or other types of display panels. When materials selected for the display panel are different, a specific structure of the pixel unit 102 can be different.

Referring to FIG. 6, the pixel array controlling circuit 200 can include a buffer layer 202, an active layer 203, a first insulating layer 214, a second insulating layer 224, a third insulating layer 234, a first metal layer 205, a second metal layer 206, a third metal layer 207, and a planarization layer 208. The buffer layer 202 is disposed on a surface of the substrate 101 within the pixel display region 800. The active layer 203 is disposed on a surface of the buffer layer 202 away from the substrate 101. The first insulating layer 214 is disposed on a surface of the active layer 203 away from the buffer layer 202. The first metal layer 205 is disposed on a surface of the first insulating layer 214 away from the active layer 203. The second insulating layer 224 is disposed on a surface of the first metal layer 205 away from the first insulating layer 214. The second metal layer 206 is disposed on a surface of the second insulating layer 224 away from the first metal layer 205. The third insulating layer 234 is disposed on a surface of the second metal layer 206 away from the second insulating layer 224. The third metal layer 207 is disposed on a surface of the third insulating layer 234 away from the second metal layer 206. The planarization layer 208 is disposed on a surface of the third metal layer 207 away from the third insulating layer 234.

In the pixel display region 800, a specific structure of each layer in the pixel array controlling circuit 200 can be specifically designed according to design requirements of those skilled in the art. For example, the material and thickness of the buffer layer 202 are specifically designed according to the design requirements of those skilled in the art. For another example, a gate layer of the pixel array controlling circuit 200 can be disposed on any one of the active layer 203, the first metal layer 205, and the third metal layer 207. Therefore, the specific structure of each layer of the pixel array controlling circuit 200 will not be described in detail herein.

Referring to FIG. 7, the electroluminescent diode 300 can include an anode layer 310, light transmissive units 320, a cathode layer 330, and a light extraction layer 340. The anode layer 310 is disposed on a surface of the pixel array controlling circuit 200 away from the substrate 101. The light transmissive units 320 are disposed on a surface of the anode layer 310 away from the pixel array controlling circuit 200. The cathode layer 330 is disposed on a surface of the light transmissive units 320 away from the anode layer 310. The light extraction layer 340 is disposed on a surface of the cathode layer 330 away from the light transmissive units 320. In the pixel display region 800, the light transmissive units 320 perform light emission display through a cooperation of the anode layer 310, the cathode layer 330, and the light extraction layer 340. A function of the light transmissive units 320 within the light transmissive region 700 is to transmit light. The light transmissive units 320 do not display in the light transmissive region 700. The electroluminescent diode 300 can be made as a top light emitting device or a bottom light emitting device. In the pixel display region 800, a specific structure of the electroluminescent diode 300 can be specifically designed according to the design requirements of those skilled in the art, and details are not described herein again.

In an embodiment, the light transmissive units 320 include a hole injection layer 321, a hole transport layer 322, an electron blocking layer 323, a light emitting layer 324, a hole blocking layer 325, an electron transport layer 326, and an electron injection layer 327 which are sequentially stacked. In the present embodiment, in the light transmissive region 700, the hole injecting layer 321 is directly attached to the surface of the substrate 101.

The hole injection layer 321 is disposed within the light transmissive region 700 and overlays the substrate 101. The hole injection layer 321 is directly attached to the surface of the substrate 101. The hole transport layer 322 overlays a surface of the hole injection layer 321 away from the substrate 101. The electron blocking layer 323 overlays a surface of the hole transport layer 322 away from the hole injection layer 321. The light emitting layer 324 overlays a surface of the electron blocking layer 323 away from the hole transport layer 322. The hole blocking layer 325 overlays a surface of the light emitting layer 324 away from the electron blocking layer 323. The electron transport layer 326 overlays a surface of the hole blocking layer 325 away from the light emitting layer 324. The electron injection layer 327 overlays a surface of the electron transport layer 326 away from the hole blocking layer 325.

In the present embodiment, in the light transmissive region 700, the hole injecting layer 321 is directly attached to the surface of the substrate 101. In the light transmissive region 700, arrangement manners and steps of various layers of the light transmissive units 320 are the same as those of the pixel display region 800. In this way, cost of the process can be saved and difficulty of the process can be reduced. In the manufacturing process of the display panel 10, it is not necessary to manufacture a more complicated mask, and the light transmissive region 700 and the pixel display region 800 can be formed without adding further manufacturing process.

Figure 8:
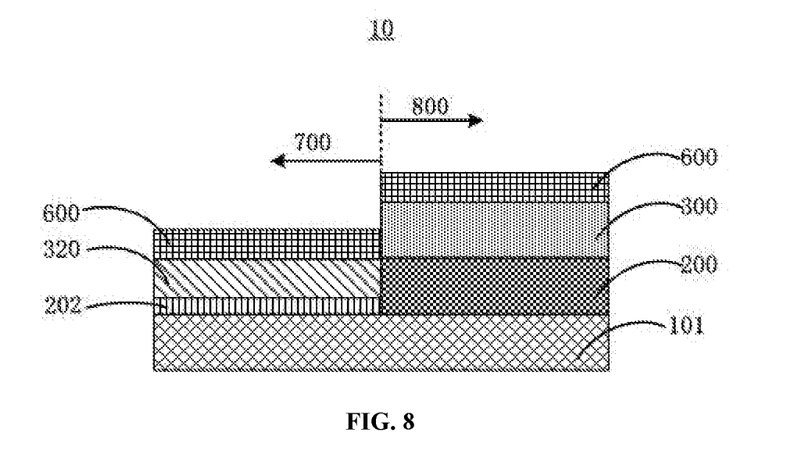
FIG. 8 is a schematic diagram of a display panel according to an embodiment.

Referring to FIG. 8, in an embodiment, the display panel 10 further includes a buffer layer 202. The buffer layer 202 is disposed between the substrate 101 within the light transmissive region 700 and the plurality of light transmissive units 320, and the buffer layer 202 is directly attached to the substrate 101.

In this embodiment, the display panel 10 is further provided with a buffer layer 202 within the light transmissive region 700. When the buffer layer 202 is deposited thereon within the pixel display region 800, the buffer layer 202 is deposited thereon within the light transmissive region 700 at the same time. In this embodiment, due to the structural arrangement of the light transmissive region 700, the cost of the process can be saved and the difficulty of the process may be reduced. In the manufacturing process of the display panel 10, it is not necessary to manufacture a more complicated mask, and the light transmissive region 700 and the pixel display region 800 can be formed without adding further manufacturing process.

Figure 9:
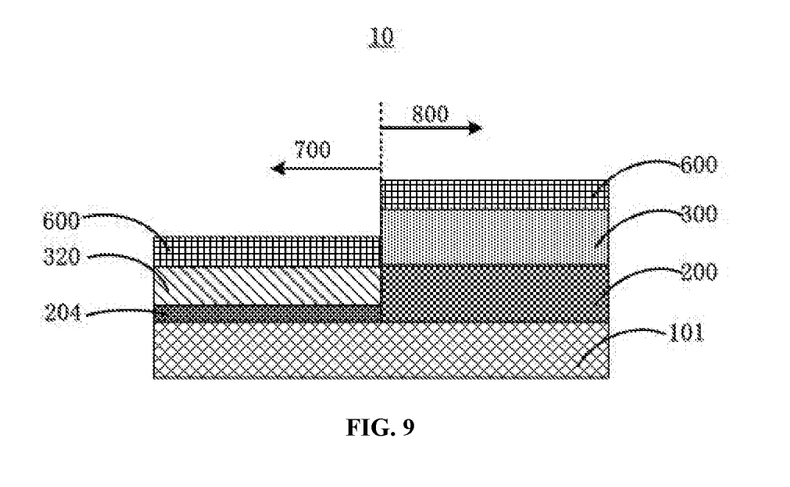
FIG. 9 is a schematic diagram of a display panel according to another embodiment.

Referring to FIG. 9, in an embodiment, the display panel 10 further includes a dielectric layer 204. The dielectric layer 204 is disposed between the substrate 101 within the light transmissive region 700 and the plurality of light transmissive units 320. And the dielectric layer 204 is directly attached to the substrate 101.

In this embodiment, the dielectric layer 204 can be an insulating layer. Thickness of the dielectric layer 204 is also not limited herein. The dielectric layer 204 can include a first insulating layer 214, a second insulating layer 224, and a third insulating layer 234. When the first insulating layer 214, the second insulating layer 224, and the third insulating layer 234 are deposited thereon within the light transmissive region 700 respectively, the first insulating layer 214, the second insulating layer 224, and the third insulating layer 234 are deposited thereon within the pixel display region 800 respectively at the same time. In this embodiment, due to the structural arrangement of the light transmissive region 700, the cost of the process can be saved and the difficulty of the process can be reduced. In the manufacturing process of the display panel 10, it is not necessary to manufacture a more complicated mask, and the light transmissive region 700 and the pixel display region 800 can be formed without adding further manufacturing process.

Figure 10:
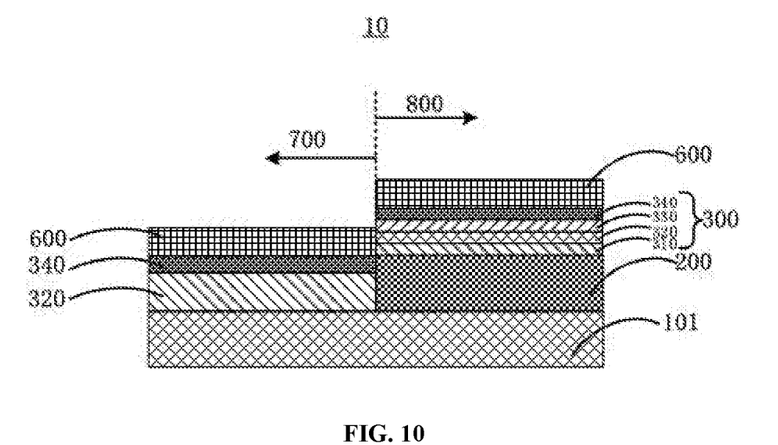
FIG. 10 is a schematic diagram of a display panel according to still another embodiment.

Referring to FIG. 10, in an embodiment, the display panel 10 further includes a light extraction layer 340. The light extraction layer 340 is disposed between the plurality of light transmissive units 320 and the package layer 600 within the light transmissive region 700.

In this embodiment, material and thickness of the light extraction layer 340 and the light extraction layer 340 located within the pixel display region 800 can be the same. The light extraction layer 340 located within the pixel display region 800 is shown in FIG. 7. When the light extraction layer 340 is deposited thereon within the pixel display region 800, the light extraction layer 340 is deposited thereon within the light transmissive region 700 at the same time. In this embodiment, according to the structural arrangement of the light transmissive region 700, the cost of the process can be saved and the difficulty of the process can be reduced. In the manufacturing process of the display panel 10, it is not necessary to manufacture a more complicated mask, and the light transmissive region 700 and the pixel display region 800 can be formed without adding further manufacturing process.

In one embodiment, a light transmittance of the light transmissive region 700 is equal to or greater than 70%. In this embodiment, the light transmissive region 700 can include a partial region of the substrate 101, the buffer layer 202, the dielectric layer 204, the planarization layer 208, the light transmissive units 320, the light extraction layer 340, and the package layer 600. Alternatively, the light transmissive region 700 includes at least a partial region of the substrate 101, the light transmissive units 320, and the package layer 600. A total light transmittance of each of the aforementioned layers can be greater than 70%. The light transmittance of the light transmissive region 700 is greater than 70%, so that an imaging effect of a camera disposed under the light transmissive region 700 is better, and a signal transmission effect of various sensors is better. Therefore, in some embodiments, the light transmittance of the light transmissive region 700 can reach 80% to 90%. The light transmittance of the light transmissive region 700 is high, and the display effect of the display panel 10 in the pixel display region 800 is not affected since the process of notching and cutting is not performed.

Figure 12:
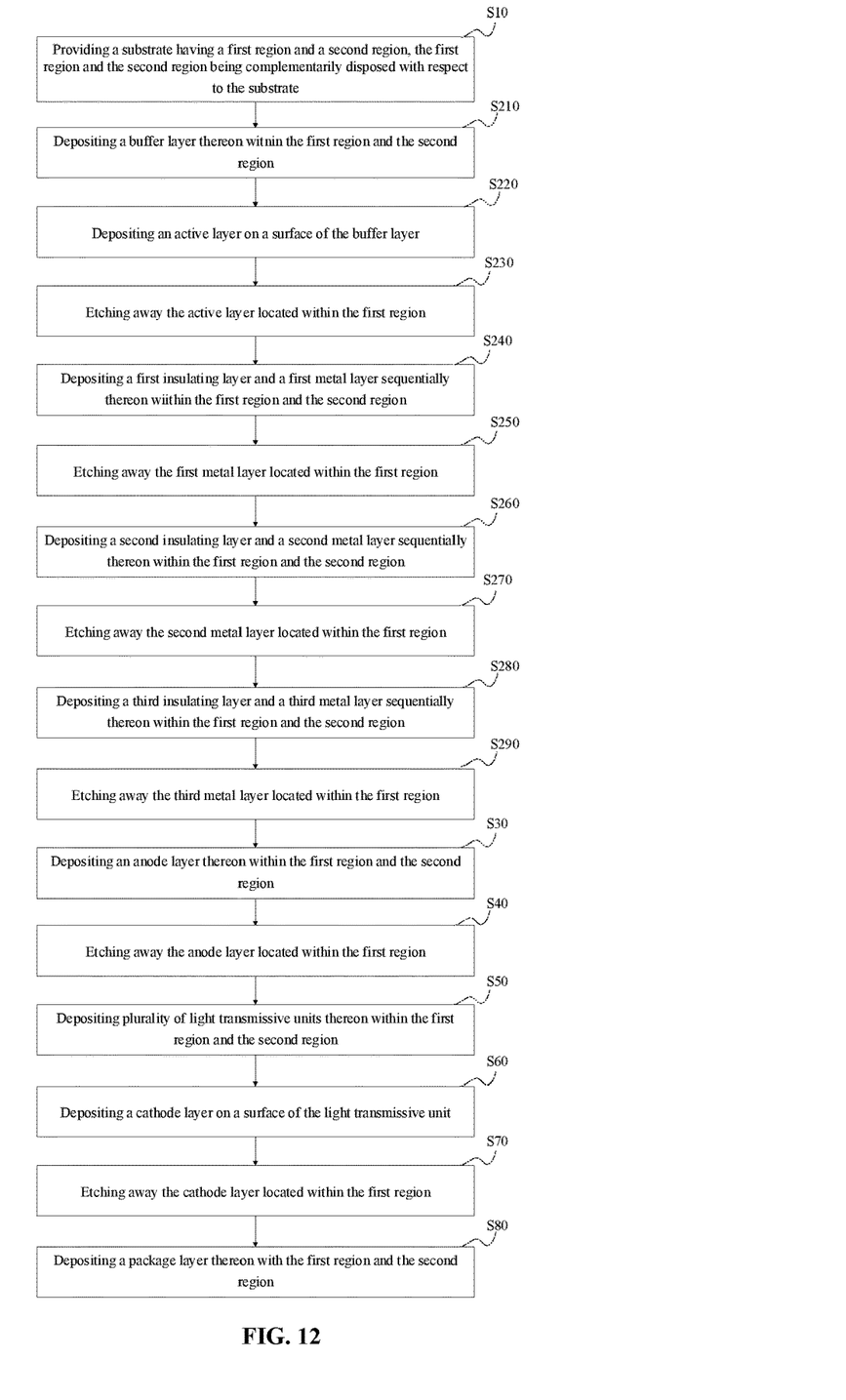
FIG. 12 is a schematic diagram of a display panel according to an embodiment.

Referring to FIG. 12, in an embodiment, a manufacturing method of a display panel is provided. The manufacturing method includes the following steps.

Figure 11:
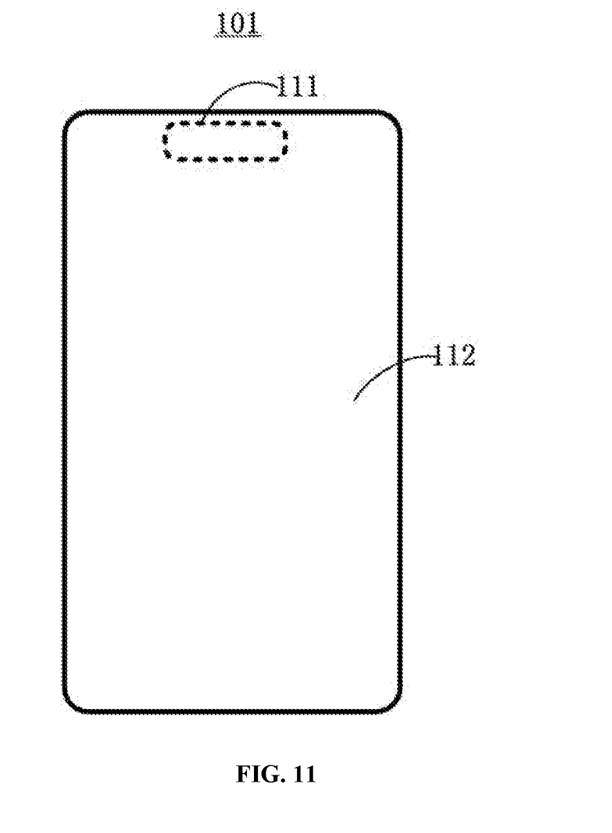
FIG. 11 is a flowchart of a manufacturing method of a display panel according to an embodiment.

In step S10, a substrate 101 is provided. Referring to FIG. 11, the substrate 101 has a first region 111 and a second region 112. The first region 111 and the second region 112 are complementarily disposed with respect to the substrate 101. A position, shape, and size of the first region 111 are not specifically limited herein. In addition, the number of the first regions 111 is not specifically limited herein. The first region 111 and the second region 112 are complementary with respect to the display panel 10. For example, if the display panel 10 is provided with one first region 111, then other regions of the display panel 10 are the second region 112.

In step S210, a buffer layer 202 is deposited thereon within the first region 111 and the second region 112.

In step S220, an active layer 203 is deposited on a surface of the buffer layer 202.

In step S230, the active layer 203 located within the first region 111 is etched away.

In step S240, a first insulating layer 214 and a first metal layer 205 are sequentially deposited thereon within the first region 111 and the second region 112.

In step S250, the first metal layer 205 located within the first region 111 is etched away.

In step S260, a second insulating layer 224 and a second metal layer 206 are sequentially deposited thereon within the first region 111 and the second region 112.

In step S270, the second metal layer 206 located within the first region 111 is etched away.

In step S280, a third insulating layer 234 and a third metal layer 207 are sequentially deposited thereon within the first region 111 and the second region 112.

In step S290, the third metal layer 207 located within the first region 111 is etched away.

In the step S210 to the step S290, when depositing respective film layers, the respective film layers are deposited thereon within both the first region 111 and the second region 112. When etching a portion of the film layers, only a portion of the film layers located within the first region 111 is etched. For example, the active layer 203, the first metal layer 205, the second metal layer 206, and the third metal layer 207, etc., which have a light transmittance less than 70% are required to be etched away.

In step S30, a anode layer 310 is deposited thereon within the first region 111 and the second region 112.

In step S40, the anode layer 310 located within the first region 111 is etched away.

In step S50, a plurality of light transmissive units 320 are deposited thereon within the first region 111 and the second region 112.

In step S60, a cathode layer 330 is deposited on a surface of the plurality of light transmissive units 320. The cathode layer 330 can be provided as a semi-reflective semi-transmissive metal electrode layer.

In step S70, the cathode layer 330 located within the first region 111 is etched away.

In steps S30 to S70, the anode layer 310, the plurality of light transmissive units 320, and the cathode layer 330 are deposited thereon within both the first region 111 and the second region 112. The anode layer 310 and the cathode layer 330 are metal electrode layers, and their light transmittances are both less than 70%. Film layers of both the anode layer 310 and the cathode layer 330 are required to be etched away.

In step S80, a package layer 600 is deposited thereon within the first region 111 and the second region 112.

In this embodiment, the afore-described various deposition steps and etching steps can be set according to design requirements of those skilled in the art. For example, etching can be performed in a patterned manner during the etching process. A specific pattern to be etched needs to be selected in combination with the design requirements of the light transmissive region 700 and the pixel display region 800. In this embodiment, the manufacturing method of the display panel is simple and easy to implement. The method adds the step of etching away a portion of the film layers located within the light transmissive region 700. Each of the film layers having a light transmittance less than 70% in the light transmissive region 700 is etched away. In this embodiment, the display panel 10 has a different structure in the light transmissive region 700 and the pixel display region 800. The position below the light transmissive region 700 of the display panel 10 can be used to place a camera, an earpiece, a fingerprint recognition, or a physical button. According to the manufacturing method, the cutting process is omitted, and defects in the display, touch, and process of the display panel 10 are avoided.

In an embodiment, after step S290, the method further includes a step S291. In step S291, the buffer layer 202, the first insulating layer 214, the second insulating layer 224, and the third insulating layer 234 located within the first region 111 are etched away.

In this embodiment, all the film layers of the pixel array controlling circuit 200 located within the light transmissive region 700 are completely etched away. In this way, the light transmittance of the light transmissive region 700 is able to be maintained in a range of 80% to 90%.

In an embodiment, after step S290, the method further includes a step S293. In step S293, a planarization layer 208 is deposited thereon within the first region 111 and the second region 112.

In this embodiment, the planarization layer 208 is added to the light transmissive region 700. A light transmittance of the planarization layer 208 is also high, so that the light transmittance of the light transmissive region 700 is able to be maintained in the range of 80% to 90%.

In an embodiment, after step S70, the method further includes a step S710. In step S710, a light extraction layer 340 is deposited thereon within the first region 111 and the second region 112.

In this embodiment, when the light extraction layer 340 is disposed thereon within the light transmissive region 700, the same deposition process can be employed as the deposition of the light extraction layer 340 thereon within the second region 112. In this way, cost of the process can be saved and a difficulty of the process can be reduced. In the manufacturing process of the display panel 10, it is not necessary to manufacture a more complicated mask, and the light transmissive region 700 having a relatively high light transmittance can be formed without adding further manufacturing process.

The technical features of the above-described embodiments can be combined arbitrarily. For the sake of brevity of description, not all possible combinations of the technical features in the above embodiments are described. However, as long as there is no contradiction between the combinations of these technical features, all the combinations should be considered as the scope of this disclosure.

The above-mentioned embodiments are merely illustrative of several embodiments of the present disclosure, and the description thereof is more specific and detailed, but is not intended to limit the scope of the present disclosure. It should be noted that a number of variations and modifications can be made by those skilled in the art without departing from the spirit and scope of the present disclosure. Therefore, the scope of the present disclosure should be determined by the appended claims.

The invention claimed is:
1. A display panel, comprising:
 a substrate having a light transmissive region and a pixel display region, the light transmissive region and the pixel display region being complementarily disposed with respect to the substrate, wherein the light transmission region is disposed at an uppermost center position of the display panel;
 a plurality of light transmissive units overlaying a surface of the substrate positioned within the light transmissive region;

a package layer overlaying the plurality of light transmissive units; and a light extraction layer disposed between the plurality of light transmissive units and the package layer in both the light transmissive region and the pixel display region, a thickness of the light extraction layer positioned in the light transmissive region being the same as a thickness of the light extraction layer positioned in the pixel display region.

2. The display panel of claim 1 further comprising a buffer layer disposed between the surface of the substrate located within the light transmissive region and the plurality of light transmissive units.

3. The display panel of claim 1, further comprising a dielectric layer disposed between the surface of the substrate located within the light transmissive region and the plurality of light transmissive units.

4. The display panel of claim 1, wherein each of the light transmission units includes:
   a hole injection layer overlaying the surface of the substrate located within the light transmissive region;
   a hole transport layer overlaying a surface of the hole injection layer away from the substrate;
   an electron blocking layer overlaying a surface of the hole transport layer away from the hole injection layer;
   a light emitting layer overlaying a surface of the electron blocking layer away from the hole transport layer;
   a hole blocking layer overlaying a surface of the light emitting layer away from the electron blocking layer;
   an electron transport layer overlaying a surface of the hole blocking layer away from the light emitting layer; and
   an electron injection layer overlaying a surface of the electron transport layer away from the hole blocking layer.

5. The display panel of claim 1 further comprising a pixel unit disposed in a region of the substrate within the pixel display region, the pixel unit comprising a pixel array controlling circuit and an electroluminescent diode electrically connected to the pixel array controlling circuit.

6. The display panel of claim 5, wherein the pixel array controlling circuit comprises:
   a buffer layer disposed on a surface of the substrate located within the pixel display region;
   an active layer disposed on a surface of the buffer layer away from the substrate;
   a first insulating layer disposed on a surface of the active layer away from the buffer layer;
   a first metal layer disposed on a surface of the first insulating layer away from the active layer;
   a second insulating layer disposed on a surface of the first metal layer away from the first insulating layer;
   a second metal layer disposed on a surface of the second insulating layer away from the first metal layer;
   a third insulating layer disposed on a surface of the second metal layer away from the second insulating layer;
   a third metal layer disposed on a surface of the third insulating layer away from the second metal layer; and
   a planarization layer disposed on a surface of the third metal layer away from the third insulating layer.

7. The display panel of claim 5, wherein the electroluminescent diode comprises:
   an anode layer disposed on a surface of the pixel array controlling circuit away from the substrate;
   the plurality of light transmissive units disposed on a surface of the anode layer away from the pixel array controlling circuit;
   a cathode layer disposed on a surface of the light transmissive units away from the anode layer; and
   a light extraction layer disposed on a surface of the cathode layer away from the light transmissive unit.

8. The display panel of claim 1, wherein a light transmittance of the light transmissive region is equal to or greater than 70%.

9. The display panel of claim 1, wherein the plurality of light transmissive units avoid to include an electrode plate for driving the plurality of light transmissive units.

\* \* \* \* \*